(12) United States Patent
Jeon et al.

(10) Patent No.: US 11,327,544 B2
(45) Date of Patent: May 10, 2022

(54) MEMORY SYSTEM AND OPERATION METHOD THEREOF

(71) Applicant: SK hynix Inc., Gyeonggi-do (KR)

(72) Inventors: Jeong-Ho Jeon, Gyeonggi-do (KR); Dal-Gon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 104 days.

(21) Appl. No.: 16/810,929

(22) Filed: Mar. 6, 2020

(65) Prior Publication Data

US 2021/0011537 A1 Jan. 14, 2021

(30) Foreign Application Priority Data

Jul. 8, 2019 (KR) ........................ 10-2019-0082001

(51) Int. Cl.
| | | |
|---|---|---|
| *G06F 1/00* | (2006.01) | |
| *G06F 1/28* | (2006.01) | |
| *G11C 16/30* | (2006.01) | |
| *G06F 3/06* | (2006.01) | |
| *G11C 16/04* | (2006.01) | |
| *G06F 1/3203* | (2019.01) | |

(52) U.S. Cl.
CPC .............. *G06F 1/28* (2013.01); *G06F 3/0619* (2013.01); *G06F 3/0659* (2013.01); *G06F 3/0679* (2013.01); *G11C 16/30* (2013.01); *G06F 1/3203* (2013.01); *G11C 16/0483* (2013.01)

(58) Field of Classification Search
CPC ........ G06F 1/28; G06F 3/0659; G06F 3/0679; G06F 3/0619; G06F 1/3275; G06F 1/263; G06F 1/3225; Y02D 10/00; G11C 16/30; G11C 16/0483; G11C 29/1201; G11C 29/12015; G11C 5/141; G11C 5/143; G11C 5/148; G11C 29/021; G11C 5/14
USPC ......................................................... 713/340
See application file for complete search history.

(56) References Cited

U.S. PATENT DOCUMENTS

| | | | | |
|---|---|---|---|---|
| 2003/0159278 | A1* | 8/2003 | Peddle .................... | B82Y 10/00 29/832 |
| 2003/0202395 | A1* | 10/2003 | Lee ................... | G11C 29/12005 365/200 |
| 2010/0202239 | A1* | 8/2010 | Moshayedi ............ | G11C 5/141 365/229 |
| 2010/0332858 | A1* | 12/2010 | Trantham .................. | G06F 1/30 713/300 |

(Continued)

FOREIGN PATENT DOCUMENTS

| | | |
|---|---|---|
| KR | 10-2018-0074301 | 7/2018 |
| KR | 10-2018-0117549 | 10/2018 |

*Primary Examiner* — Volvick Derose
(74) *Attorney, Agent, or Firm* — IP & T Group LLP

(57) ABSTRACT

A memory system may include: a memory device suitable for storing data; a controller suitable for controlling the memory device; a power manager suitable for receiving external power, and supplying operation power to the memory device and the controller; and a plurality of auxiliary power circuits suitable for receiving the operation power from the power manager, storing the received power, and supplying auxiliary power to the power manager when the external power is removed. The power manager may group and manage selected auxiliary power circuits among the plurality of auxiliary power circuits as a test group, and perform a full discharge test on the selected auxiliary power circuits.

15 Claims, 9 Drawing Sheets

(56) References Cited

U.S. PATENT DOCUMENTS

| | | | |
|---|---|---|---|
| 2010/0332862 A1* | 12/2010 | Lester | G11C 5/141 |
| | | | 713/300 |
| 2010/0332896 A1* | 12/2010 | Wilson | G06F 1/30 |
| | | | 714/14 |
| 2012/0198136 A1* | 8/2012 | Moshayedi | G06F 12/0246 |
| | | | 711/103 |
| 2018/0183252 A1* | 6/2018 | Kim | H02J 7/04 |
| 2018/0308527 A1* | 10/2018 | Narayanan | G06F 1/30 |
| 2019/0079125 A1* | 3/2019 | Abrahams | G01R 21/006 |
| 2019/0103761 A1* | 4/2019 | Wyma | H02J 7/0021 |
| 2020/0014000 A1* | 1/2020 | Roddy | H01M 50/256 |
| 2020/0106063 A1* | 4/2020 | Roddy | B60L 58/21 |
| 2020/0284846 A1* | 9/2020 | Pajovic | G06N 20/00 |
| 2021/0036540 A1* | 2/2021 | Suljic | G11C 5/141 |

\* cited by examiner

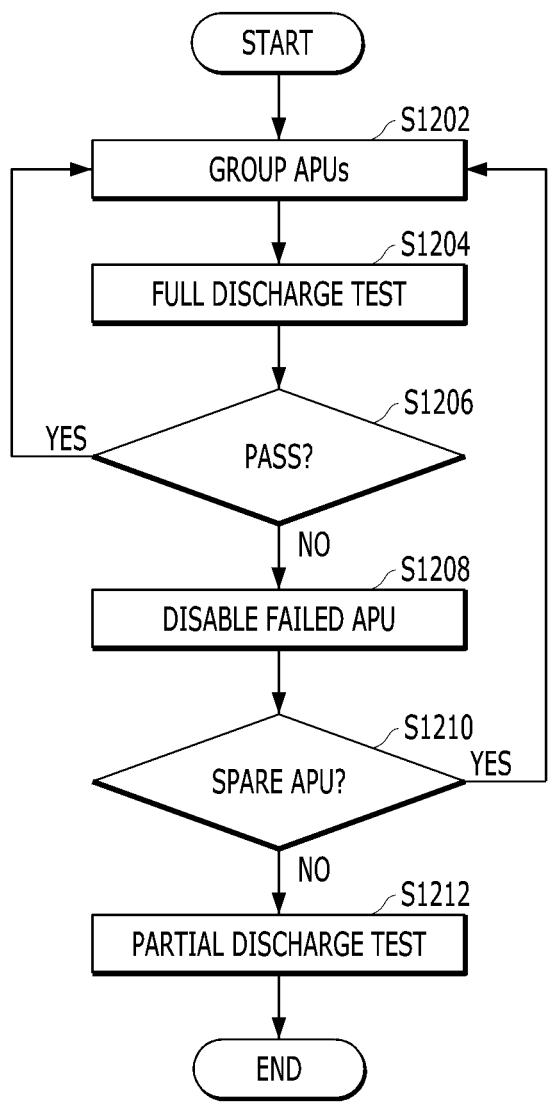

MEMORY SYSTEM AND OPERATION METHOD THEREOF

CROSS-REFERENCE TO RELATED APPLICATION

This application claims priority under 35 U.S.C. § 119 to Korean Patent Application No. 10-2019-0082001 filed on Jul. 8, 2019, which is incorporated herein by reference in its entirety.

BACKGROUND

1. Field

Various embodiments relate to a memory system.

2. Discussion of the Related Art

The computer environment paradigm has been transitioning to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Since they have no moving parts, memory systems provide advantages such as excellent stability and durability, high information access speed, and low power consumption. Examples of memory systems having such advantages include universal serial bus (USB) memory devices, memory cards having various interfaces, and solid state drives (SSDs).

SUMMARY

Various embodiments are directed to a memory system capable of assuring reliability by guaranteeing a stable system shutdown even in case of a sudden power off (SPO), and an operation method thereof.

In an embodiment, a memory system may include: a memory device suitable for storing data; a controller suitable for controlling the memory device; a power manager suitable for receiving external power, and supplying operation power to the memory device and the controller; and a plurality of auxiliary power circuits suitable for receiving the operation power from the power manager and storing the received power, supplying auxiliary power to the power manager when the external power is removed, wherein the power manager groups and manages selected auxiliary power circuits among the plurality of auxiliary power circuits as a test group, and performs a full discharge test on the selected auxiliary power circuits.

In an embodiment, there is provided an operating method of a memory system which includes a plurality of auxiliary power circuits for supplying auxiliary power to the memory system when external power is removed. The operating method may include: grouping, as a test group, selected auxiliary power circuits among the plurality of auxiliary power circuits; and performing a full discharge test on the selected auxiliary power circuits.

In an embodiment, a memory system comprising: a memory device; and a controller coupled to the memory device, including: a power manager suitable for receiving external power, and supplying operation power to the memory device and the controller; and a plurality of auxiliary power circuits, each suitable for receiving the operation power from the power manager, charging the operation power as auxiliary power, and supplying the auxiliary power to the power manager in response to shutdown of the external power, wherein the power manager performs a discharge test operation on selected auxiliary power circuits among the plurality of auxiliary power circuits such that all of the plurality of auxiliary power circuits is tested.

BRIEF DESCRIPTION OF THE DRAWINGS

FIG. 12 is a flowchart illustrating an operation of the auxiliary power controller in accordance with the embodiment.

DETAILED DESCRIPTION

Hereafter, embodiments of the present invention will be described in detail with reference to the accompanying drawings. It should be noted that the following descriptions will be focused on portions required for understanding an operation in accordance with an embodiment, and descriptions of the other portions will be ruled out in order not to unnecessarily obscure subject matters of the present disclosure. We note, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains.

It is noted that reference to "an embodiment," "another embodiment" or the like does not necessarily mean only one embodiment, and different references to any such phrase are not necessarily to the same embodiment(s).

Hereafter, various embodiments will be described in more detail with reference to the accompanying drawings.

Figure 1:
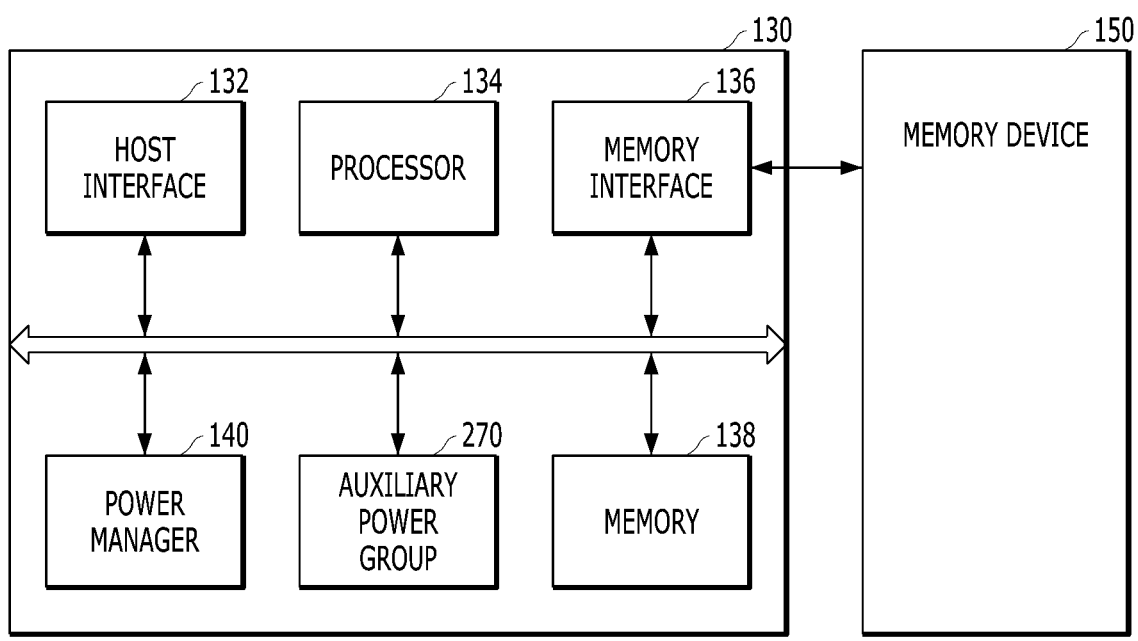
FIG. 1 is a diagram schematically illustrating a memory system in accordance with an embodiment.

FIG. 1 is a diagram schematically illustrating a memory system 110 in accordance with an embodiment.

Referring to FIG. 1, the memory system 110 may operate to store data for a host in response to a request of the host. Non-limiting examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC. The SD card may include a mini-SD card and micro-SD card.

The memory system 110 may be embodied by various types of storage devices. Examples of such storage devices may include, but are not limited to, volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM or ReRAM) and a flash memory. The flash memory may have a 3-dimensional (3D) stack structure.

The host may include any of various portable electronic devices such as a mobile phone, MP3 player and laptop computer, or any of various non-portable electronic devices such as a desktop computer, a game machine, a television (TV), and a projector.

The host may include at least one operating system (OS), which may manage and control overall functions and operations of the host, and provide operation between the host and a user using the data processing system 100 or the memory system 110. The OS may support functions and operations corresponding to the use purpose and usage. For example, the OS may be divided into a general OS and a mobile OS, depending on the mobility of the host. The general OS may be divided into a personal OS and an enterprise OS, depending on the environment.

The memory system 110 may include a memory device 150 and a controller 130. The controller 130 may include a host interface 132, a processor 134, a memory interface 136 and a memory 138. which are operatively coupled via an internal bus. Further, the controller 130 may include a power manager 140 and an auxiliary power group 270. Alternatively, the power manager 140 and an auxiliary power group 270 may be configured outside of the controller 130. The memory device 150 may store data for a host, and the controller 130 may control data storage into the memory device 150. The power manager 140 may receive external power from the host, and supply operation power to the memory device 150 and the controller 130. The auxiliary power group 270 may receive the operation power from the power manager 140 and store the received operation power. Further, the auxiliary power group 270 may supply auxiliary power to the power manager 140 when the supply of the external power is removed.

The controller 130 and the memory device 150 may be integrated into a single semiconductor device. For example, the controller 130 and the memory device 150 may be integrated as one semiconductor device to constitute a solid state drive (SSD). When the memory system 110 is used as an SSD, the operating speed of the host connected to the memory system 110 can be improved. In addition, the controller 130 and the memory device 150 may be integrated as one semiconductor device to constitute a memory card. For example, the controller 130 and the memory device 150 may constitute a memory card such as a personal computer memory card international association (PCMCIA) card, compact flash (CF) card, smart media (SM) card, memory stick, multimedia card (MMC) including reduced size MMC (RS-MMC) and micro-MMC, secure digital (SD) card including mini-SD card, micro-SD card and SDHC card, or universal flash storage (UFS) device.

The power manager 140 and the auxiliary power group 270 may be configured outside or inside the controller 130, depending on an implementation. FIG. 1 illustrates the case in which the power manager 140 and the auxiliary power group 270 are configured in the controller 130.

The memory device 150 may be a nonvolatile memory device and may retain data stored therein even though power is not supplied. The memory device 150 may store data provided from the host through a write operation, and provide data stored therein to the host through a read operation. The memory device 150 may include a plurality of memory blocks each of which may include a plurality of pages, and each of the pages may include a plurality of memory cells coupled to a word line. In an embodiment, the memory device 150 may be a flash memory. The flash memory may have a 3-dimensional (3D) stack structure.

In other words, the controller 130 may control the memory device 150 in response to a request received from the host 102. The controller 130 may perform a foreground operation as the command operation corresponding to the command received from the host. The controller 130 may control a read, program, erase operation of a memory device 150.

The controller 130 may perform a background operation onto the memory device 150 through the processor 134, which is realized as a microprocessor or a CPU. For example, the background operation performed onto the memory device 150 may include a garbage collection (GC) operation, a wear-leveling (WL) operation, a map flush operation, or a bad block management operation.

The host interface 132 may be configured to process a command and data of the host. The host interface 132 may communicate with the host through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and integrated drive electronics (IDE).

The host interface 132 may be driven through firmware referred to as a host interface layer (HIL) in order to exchange data with the host.

The processor 134 may control the overall operations of the memory system 110. The processor 134 may drive firmware to control the overall operations of the memory system 110. The firmware may be referred to as flash translation layer (FTL). The processor 134 may be realized as a microprocessor or a central processing unit (CPU).

The memory interface 136 may serve as a memory/storage interface for interfacing the controller 130 and the memory device 150 such that the controller 130 controls the memory device 150 in response to a request from the host 102. When the memory device 150 is a flash memory (e.g., a NAND flash memory), the memory interface 136 may generate a control signal for the memory device 150 and process data to be provided to the memory device 150 under the control of the processor 134. The memory interface 136 may work as an interface (e.g., a NAND flash interface) for processing a command and data between the controller 130 and the memory device 150. Specifically, the memory interface 136 may support data transfer between the controller 130 and the memory device 150.

The memory interface 136 may be driven through firmware referred to as a flash interface layer (FIL) in order to exchange data with the memory device 150.

In an implementation, the memory interface 136 may include an error correction code (ECC) component capable of detecting and correcting an error contained in the data read from the memory device 150. In other words, the ECC component may perform an error correction decoding process to the data read from the memory device 150 through an ECC value used during an ECC encoding process. According to a result of the error correction decoding process, the ECC component may output a signal, for example, an error correction success/fail signal. When the number of error bits is greater than a threshold value of correctable error bits, the ECC component may not correct the error bits, and may output an error correction fail signal.

The memory 138 may serve as a working memory of the memory system 110 and the controller 130, and store data for driving the memory system 110 and the controller 130. The controller 130 may control the memory device 150 to perform read, program and erase operations in response to a request from the host. The controller 130 may provide data read from the memory device 150 to the host, may store data provided from the host into the memory device 150. The memory 138 may store data required for the controller 130 and the memory device 150 to perform these operations.

The memory 138 may be embodied by a volatile memory. For example, the memory 138 may be embodied by a static random access memory (SRAM) or a dynamic random access memory (DRAM). The memory 138 may be disposed within or out of the controller 130. FIG. 1 exemplifies the memory 138 disposed within the controller 130. Alternatively, the memory 138 may be embodied by an external volatile memory having a memory interface transferring data between the memory 138 and the controller 130.

The power manager 140 may provide power inputted from the host to the memory system 110.

The power manager 140 may receive external power from the host and transfer operation power to the controller 130 and the memory device 150 during a normal operation. For example, the power manager 140 may provide a program voltage, a read voltage and an erase voltage of the memory device 150, and provide power for driving the processor 134 and power for retaining data stored in the memory 138.

The power manager 140 may charge the auxiliary power group 270 with the external power during a normal operation.

The auxiliary power group 270 may receive the operation power from the power manager 140 and store the received operation power, and supply auxiliary power to the power manager 140 when the external power is removed. For example, the auxiliary power group 270 may include capacitors.

When a sudden power off (SPO) is detected, the power manager 140 may transfer the auxiliary power of the auxiliary power group 270 to the controller 130 and the memory device 150. The controller 130 may stably shut down the memory system 110 using the auxiliary power group 270. For example, the memory 138 may store write data which have been received with a write request from the host, but are not yet programmed to the memory device 150. The controller 130 may store the write data stored in the memory 138 into the memory device 150 using the auxiliary power group 270, and shut down the memory system 110. The controller 130 may store the write data in the memory device 150 before the write date volatilizes, thereby maintaining the integrity of the memory system 110 for the request of the host.

When the capacitors in the auxiliary power group 270 are worn out, the power manager 140 may not provide sufficient auxiliary power to the memory system 110 in case of an SPO. The power manager 140 may perform a discharge test for periodically checking how much the auxiliary power group 270 is worn out, in order to guarantee a stable shutdown of the memory system 110.

While discharging each of the capacitors in a predetermined or set period, the power manager 140 may determine whether sufficient power can be supplied while the capacitor is discharged, during the discharge test.

For example, the power manager 140 may perform a full discharge test to measure the time required until the capacitor is fully discharged. When an SPO occurs while the full discharge test is performed, the power manager 140 may not guarantee a stable shutdown of the memory system 110.

For another example, the power manager 140 may perform a partial discharge test for measuring the time required until the capacitor is partially discharged, in order to retain the minimum amount of power for guaranteeing a stable shutdown of the memory system 110. The accuracy of the partial discharge test may be lower than that of the full discharge test. Thus, during certain partial discharge tests, a capacitor which cannot actually provide sufficient power to the memory system 110 may be determined to be a capacitor which is not worn out. Therefore, even when the power manager 140 determines the wear level of a capacitor based on the partial discharge test, it may be difficult to guarantee a stable shutdown of the memory system 110.

In accordance with an embodiment of the present disclosure, the auxiliary power group 270 may include a plurality of auxiliary power circuits. The number of the auxiliary power circuits may be greater than the minimum number of auxiliary power circuits needed for guaranteeing a stable shutdown of the memory system 110. The power manager 140 may periodically perform a discharge test on the auxiliary power group 270. The power manager 140 may retain power of the minimum number of auxiliary power circuits when performing the discharge test, and perform the full discharge test on spare auxiliary power circuits. The power manager 140 may periodically change auxiliary power circuits which are to be subjected to the full discharge test, in order to perform the full discharge test on all of the auxiliary power circuits.

In accordance with an embodiment of the present disclosure, the power manager 140 may perform the full discharge test and thus guarantee low wear levels of all auxiliary power circuits having passed the discharge test. Since the power manager 140 can retain sufficient auxiliary power even while performing the full discharge test, the power manager 140 may supply the memory system 110 with sufficient auxiliary power in case of a system shutdown, for example, when the supply of the external power is removed during the discharge test. Therefore, it is possible to enhance the reliability of the memory system 110.

Figure 2:
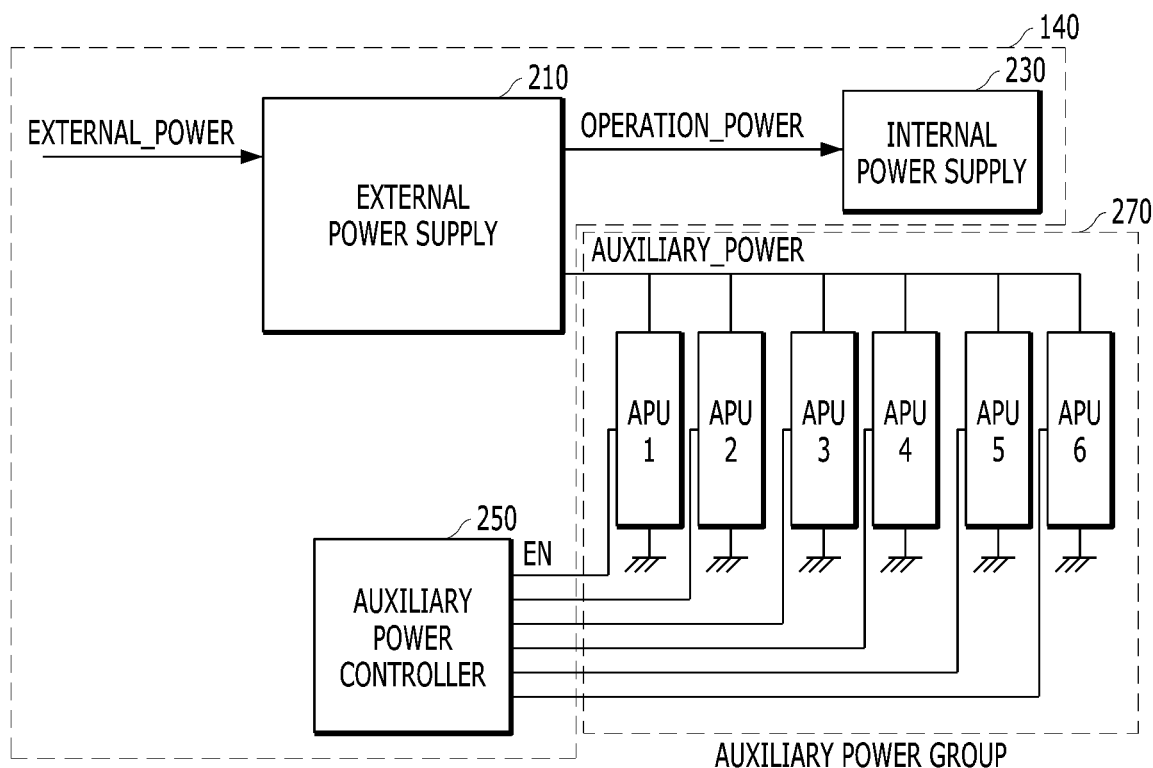
FIG. 2 is a diagram schematically illustrating a power manager in accordance with an embodiment.

FIG. 2 is a diagram schematically illustrating the power manager 140 and the auxiliary power group 270 in accordance with an embodiment of the present disclosure.

Referring to FIG. 2, the power manager 140 may include an external power supply 210, an internal power supply 230 and an auxiliary power controller 250.

The external power supply 210 may receive external power EXTERNAL_POWER from the host and charge the auxiliary power group 270, and supply the internal power supply 230 with operation power OPERATION_POWER for driving the memory system 110.

The external power supply 210 may determine whether the external power EXTERNAL_POWER is sufficiently supplied. When determining that the supply of the external power EXTERNAL_POWER has been removed (e.g., in case of a SPO), the external power supply 210 may supply auxiliary power AUXILIARY_POWER as the operation power OPERATION_POWER to the internal power supply 230. The operation of the external power supply 210 when the memory system 110 is normally operated and the operation of the external power supply 210 when the supply of the external power EXTERNAL_POWER is suddenly removed will be described in detail with reference to FIGS. 3 and 4.

The internal power supply 230 may receive the operation power OPERATION_POWER, generate operation voltages required for operating the components of the memory system 110, and supply the operation voltages to the respective components of the memory system 110. For example, the internal power supply 230 may generate a program voltage, a read voltage and an erase voltage, and supply the generated voltages to the memory device 150.

The auxiliary power group 270 may include a plurality of auxiliary power circuits APU1 to APU6. The structure of the auxiliary power circuits will be described in detail with reference to FIG. 5. The auxiliary power group 270 may include a sufficient number of auxiliary power circuits APU1 to APU6 to retain a greater amount of auxiliary power than the minimum amount of power required for stably shutting down the memory system 110. For example, the memory system 110 may require power for storing data, stored in the memory 138 which can be implemented as a volatile memory, in the memory device 150, in order to stably shut down the system. The example of FIG. 2 is based on the supposition that a minimum of four auxiliary power circuits are required to shut down the memory system 110.

The auxiliary power controller 250 may perform a discharge test on the auxiliary power circuits APU1 to APU6. When performing the discharge test, the auxiliary power controller 250 may group some of the auxiliary power circuits APU1 to APU6 as a test group, and group the other auxiliary power circuits as an operation group. The test group may indicate a group of auxiliary power circuits which are subjected to the full discharge test, when the discharge test is performed. The operation group may indicate a group of auxiliary power circuits which supply power for shutting down the memory system 110 even though the supply of the external power EXTERNAL_POWER is suddenly removed while the full discharge test is performed on the test group. The auxiliary power controller 250 may group the auxiliary power circuits APU1 to APU6 as the test group and the operation group whenever performing the discharge test, and perform the full discharge test on the test group. The auxiliary power controller 250 may group different auxiliary power circuits as the test group whenever performing the discharge test, thereby controlling all of the auxiliary power circuits APU1 to APU6 to be periodically subjected to the full discharge test. Since the auxiliary power controller 250 can control all of the auxiliary power circuits APU1 to APU6 to be periodically subjected to the full discharge test, it is possible to maintain the integrity of the memory system 110. The discharge test in accordance with an embodiment of the present disclosure will be described in detail with reference to FIGS. 6 and 7.

The auxiliary power controller 250 may selectively enable and disable the auxiliary power circuits APU1 to APU6 according to the discharge test results of the auxiliary power circuits APU1 to APU6. The capacitor of a defective auxiliary power circuit which does not pass the discharge test may operate like a short circuit or open circuit, depending on the type of a defect. When a certain capacitor operates like a short circuit such that no current flows to the corresponding capacitor, even a normal capacitor coupled in parallel to the corresponding capacitor may not supply power in case of an emergency. In accordance with an embodiment, the auxiliary power controller 250 may selectively disable the defective auxiliary power circuit.

When some auxiliary power circuits are disabled, the auxiliary power controller 250 may change the grouping method for the test group and the operation group or change the discharge test method, depending on the number of enabled auxiliary power circuits. The operation of the auxiliary power controller 250 in accordance with an embodiment of the present disclosure will be described in detail with reference to FIGS. 8 to 12.

Figure 3:
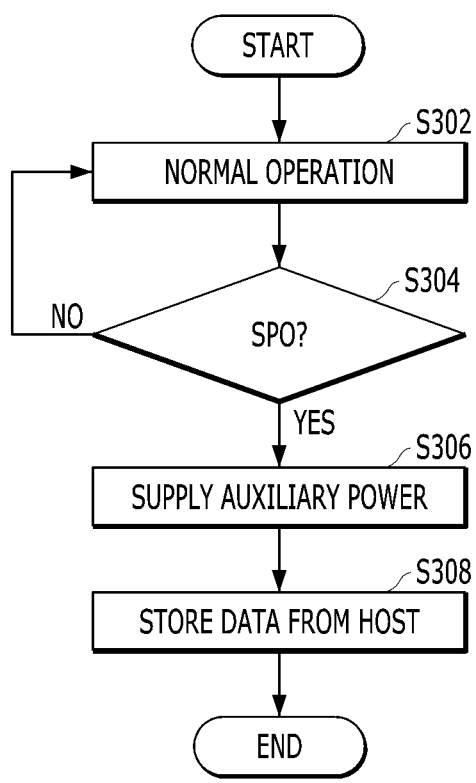
FIG. 3 is a flowchart illustrating an operation of a memory system in accordance with an embodiment.

FIG. 3 is a flowchart illustrating an operation of the memory system 100 in accordance with an embodiment.

Referring to FIG. 3, in step S302, the memory system 110 may normally operate. When the external power is stably and sufficiently supplied without any interruption or removal, the memory system 110 may normally operate. While the memory system 110 normally operates, the external power supply 210 may receive the external power EXTERNAL_POWER to charge the auxiliary power group 270, and supply the external power EXTERNAL_POWER as the operation power OPERATION_POWER to the internal power supply 230. The internal power supply 230 may receive the operation power OPERATION_POWER, generate power required for an operation of the memory system 110, and supply the generated power to the components of the memory system 110. The auxiliary power controller 250 may periodically perform the discharge test on the auxiliary power circuits. In step S304, the external power supply 210 may detect whether the supply of the external power EXTERNAL_POWER was removed, i.e. whether a sudden power off (SPO) occurred, based on the potential of the external power EXTERNAL_POWER.

When no SPO is detected ("NO" in step S304), the memory system 110 may continue the normal operation in step S302.

When an SPO is detected ("YES" in step S304), the external power supply 210 may supply the auxiliary power AUXILIARY_POWER as the operation power OPERATION_POWER to the internal power supply 230 in step S306. The external power supply 210 may provide an SPO signal to the controller 130.

In step S308, the controller 130 may store the data stored in the memory 138 into the memory device 150 using the operation power OPERATION_POWER originating from the auxiliary power AUXILIARY_POWER, and shut down the memory system 110. The memory 138 may store data which have been received from the host and are not yet stored in the memory device 150. Although an SPO occurs, the controller 130 may store the host data stored in the memory 138 into the memory device 150 before the host data volatilize, thereby maintaining the integrity of the memory system 110.

Figure 4:
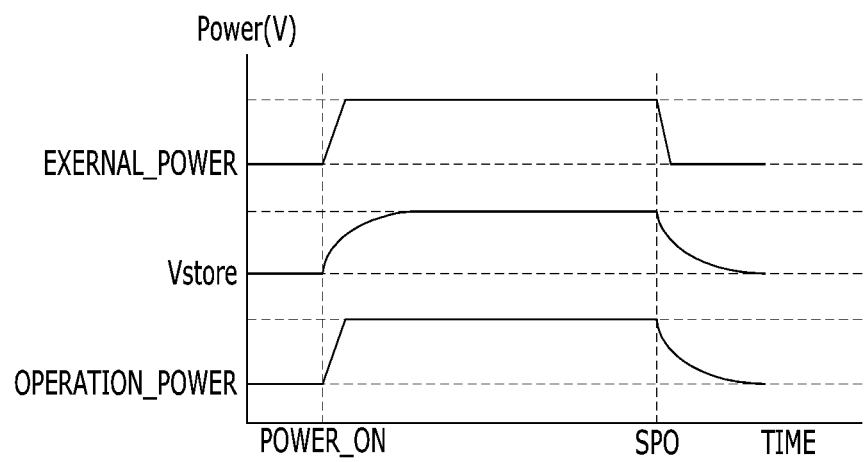
FIG. 4 is a timing diagram illustrating power of a memory system over time.

FIG. 4 is a timing diagram illustrating power of the memory system 110 over time.

As the external power EXTERNAL_POWER is supplied as the operation power OPERATION_POWER to the external power supply 210, the memory system 110 may be powered on (POWER_ON). The auxiliary power AUXILIARY_POWER may be stored by the external power supply 210.

When the external power EXTERNAL_POWER is stably supplied, the memory system 110 may perform a normal operation using the operation power OPERATION_POWER originating from the external power EXTERNAL_POWER. Since the auxiliary power controller 250 periodically performs the discharge test, the auxiliary power AUXILIARY_POWER may be repeatedly increased and/or decreased. During the discharge test, the auxiliary power circuits in the test group may be fully discharged, but the states of charge of the auxiliary power circuits in the operation group may be maintained. Thus, the entire auxiliary power AUXILIARY_POWER may not be lowered to a predetermined level or less.

When an SPO is detected (i.e., the external power EXTERNAL_POWER is not supplied), the controller 130 may operate using the operation power OPERATION_POWER originating from the auxiliary power AUXILIARY_POWER.

Figure 5:
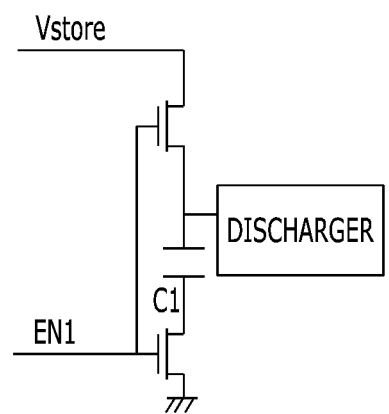
FIG. 5 is a diagram illustrating a structure of an auxiliary power unit in accordance with an embodiment.

FIG. 5 is a diagram schematically illustrating the structure of the auxiliary power circuit in accordance with an embodiment. Hereafter, the structure of the first auxiliary power circuit APU1 illustrated in FIG. 2 will be taken as an example for describing the structure of the auxiliary power circuit. However, the second to sixth auxiliary power circuits APU2 to APU6 may have the same structure as the first auxiliary power circuit APU1.

Referring to FIG. 5, the first auxiliary power circuit APU1 may include a first capacitor C1, transistors and a discharger DISCHARGER. Vstore is a voltage when the first capacitor C1 stores the auxiliary power above a threshold.

The first capacitor C1 may be a large capacitor for storing auxiliary power. Depending on an implementation, a polymer tantalum capacitor may be used as the first capacitor C1.

The transistors may be coupled in series to the first capacitor C1. The transistor may serve as a switch for adjusting a current flowing to the first capacitor C1, based on a first enable signal EN1 from the auxiliary power controller 250.

The discharger DISCHARGER may discharge the first capacitor C1 in response to control of the auxiliary power controller 250 for the discharge test.

Figure 6:
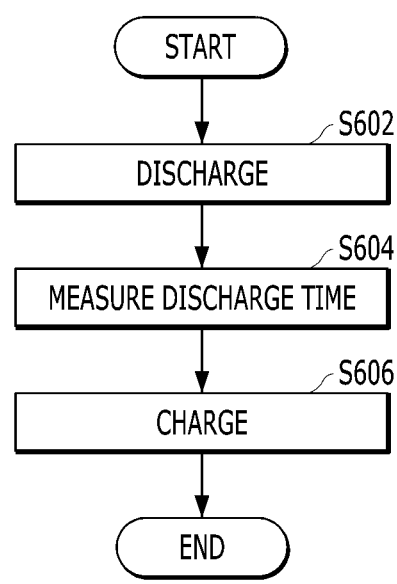
FIG. 6 is a flowchart illustrating a discharge test operation of an auxiliary power controller.

FIG. 6 is a flowchart illustrating the discharge test operation of the auxiliary power controller 250.

Referring to FIG. 6, in step S602, the auxiliary power controller 250 may control the discharger DISCHARGER to discharge the capacitor of the auxiliary power circuit. Depending on whether the auxiliary power controller 250 performs the full discharge test or the partial discharge test, the discharger DISCHARGER may fully discharge the capacitor in a full discharge test or discharge the capacitor until the potential of the capacitor reaches a predetermined potential in a partial discharge test.

In step S604, the auxiliary power controller 250 may measure the time required until the capacitor is discharged to a threshold value.

In step S606, the auxiliary power controller 250 may stop the operation of the discharger DISCHARGER, thereby charging the capacitor. When an SPO occurs, the charged capacitor may supply power to the memory system 110, thereby maintaining the integrity of the memory system 110.

Figure 7:
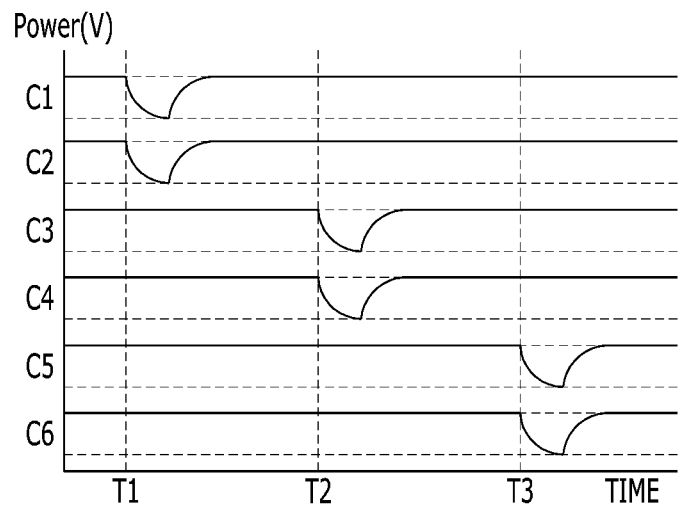
FIG. 7 is a timing diagram illustrating a discharge test in accordance with an embodiment.

FIG. 7 is a timing diagram for describing a discharge test in accordance with an embodiment. FIG. 7 illustrates the potentials of the capacitors of the auxiliary power circuits over time. For the discharge test of FIG. 7, the auxiliary power controller 250 of FIG. 2 may divide the auxiliary power circuits into the test group and the operation group in a predetermined period, in order to perform the full discharge test. In the example of the power manager 140, a minimum of four auxiliary power circuits are needed to stably shut down the memory system 110. Thus, a minimum of four auxiliary power circuits need to belong to the operation group. By way of example, FIG. 7 illustrates the case in which the auxiliary power controller 250 periodically divides the plurality of auxiliary power circuits into the operation group including four auxiliary power circuits and the test group including two auxiliary power circuits, in order to perform the discharge test.

Referring to FIG. 7, the auxiliary power controller 250 may decide the first and second auxiliary power circuits APU1 and APU2 of the plurality of auxiliary power circuits as the test group and decide the third to sixth auxiliary power circuits APU3 to APU6 as the operation group, at a first time point T1. The first to sixth capacitor C1 to C6 may associated with the first to sixth auxiliary power circuits APU1 to APU6. The auxiliary power controller 250 may perform the full discharge test by controlling the dischargers DISCHARGER of the first and second auxiliary power circuits APU1 and APU2 to fully discharge the respective auxiliary power circuits.

During the full discharge test for the first and second auxiliary power circuits APU1 and APU2, an SPO of the memory system 110 may occur. Although the SPO occurs during the full discharge test, the external power supply 210 may supply the auxiliary power AUXILIARY_POWER as the operation power OPERATION_POWER. Since the third to sixth auxiliary power circuits APU3 to APU6 are charged even though the first and second auxiliary power circuits APU1 and APU2 are discharged, the memory system 110 may be stably shut down.

At a second time point T2, the auxiliary power controller 250 may decide the third and fourth auxiliary power circuits APU3 and APU4 of the plurality of auxiliary power circuits as the test group, decide the first, second, fifth and sixth auxiliary power circuits APU1, APU2, APU5 and APU6 as the operation group, and perform the full discharge test on the test group.

At a third time point T3, the auxiliary power controller 250 may decide the fifth and sixth auxiliary power circuits APU5 and APU6 of the plurality of auxiliary power circuits as the test group, decide the first to fourth auxiliary power circuits APU1 to APU4 as the operation group, and perform the full discharge test on the test group.

In accordance with an embodiment of the present disclosure, the memory system 110 may perform the full discharge test on all of the auxiliary power circuits in a predetermined period, thereby guaranteeing the auxiliary power supply ability of the auxiliary power circuits. When performing the full discharge test on the test group, the memory system 110 may retain the power of the operation group and thus maintaining the integrity of the memory system 110 even though an SPO occurs during the full discharge test.

Figure 8:
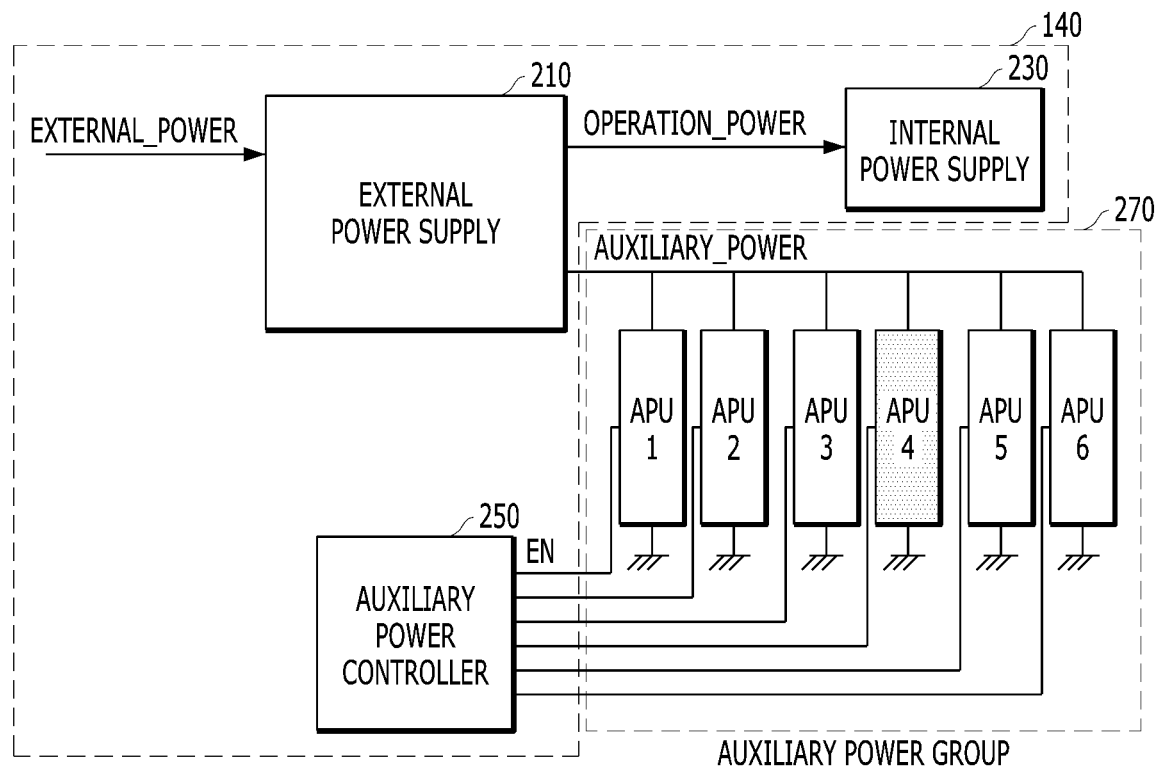
FIG. 8 is a diagram schematically illustrating a structure of a power manager in accordance with the embodiment.

FIG. 8 is a diagram schematically illustrating the structure of the power manager 140 in accordance an embodiment. By way of example, FIG. 8 illustrates the case in which one auxiliary power circuit APU4 among the auxiliary power circuits APU1 to APU6 in the power manager 140 did not pass the discharge test.

The auxiliary power controller 250 may disable the fourth auxiliary power circuit APU4 which did not pass the discharge test. In FIG. 8, a shaded portion indicates the disabled fourth auxiliary power circuit APU4.

Figure 9:
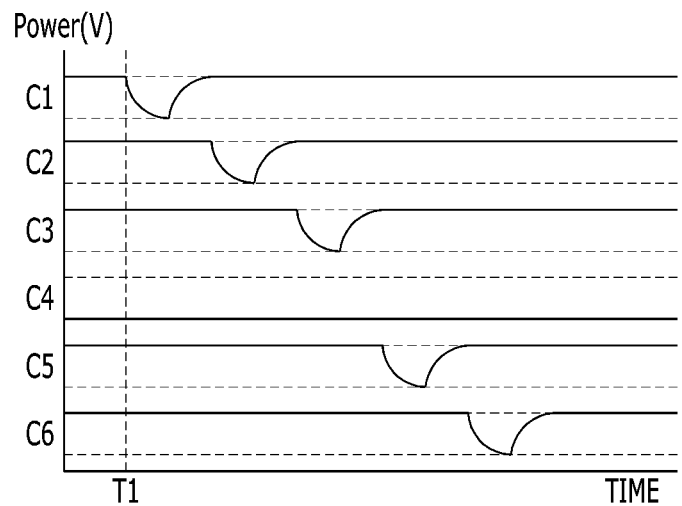
FIG. 9 is a timing diagram illustrating a discharge test in accordance with an embodiment.

FIG. 9 is a timing diagram illustrating a discharge test in accordance with an embodiment. For example, FIG. 9 illustrates the potentials of the capacitors of the auxiliary power circuits over time.

For the discharge test of FIG. 9, the auxiliary power controller 250 of FIG. 8 may divide the auxiliary power circuits into the test group and the operation group in a predetermined period, in order to perform the full discharge test. In the example of the power manager 140, a minimum of four auxiliary power circuits need to belong to the operation group. The auxiliary power controller 250 may divide the plurality of auxiliary power circuits into the operation group including four auxiliary power circuits and the test group including one auxiliary power circuit, in order to perform the discharge test.

Referring to FIG. 9, the auxiliary power controller 250 may decide the first auxiliary power circuit APU1 as the test group and decide the second, third, fifth and sixth auxiliary power circuits APU2, APU3, APU5 and APU6 as the operation group, at a first time point T1. The first to sixth capacitor C1 to C6 may associated with the first to sixth auxiliary power circuits APU1 to APU6. As shown in FIG. 9, the fourth auxiliary power circuit APU4 is disabled. The auxiliary power controller 250 may perform the full discharge test by controlling the discharger DISCHARGER of the first auxiliary power circuit APU1 to fully discharge the first auxiliary power circuit APU1.

As the case of the first auxiliary power circuit APU1, the auxiliary power controller 250 may periodically perform the full discharge test on the second, third, fifth and sixth auxiliary power circuits APU2, APU3, APU5 and APU6.

Figure 10:
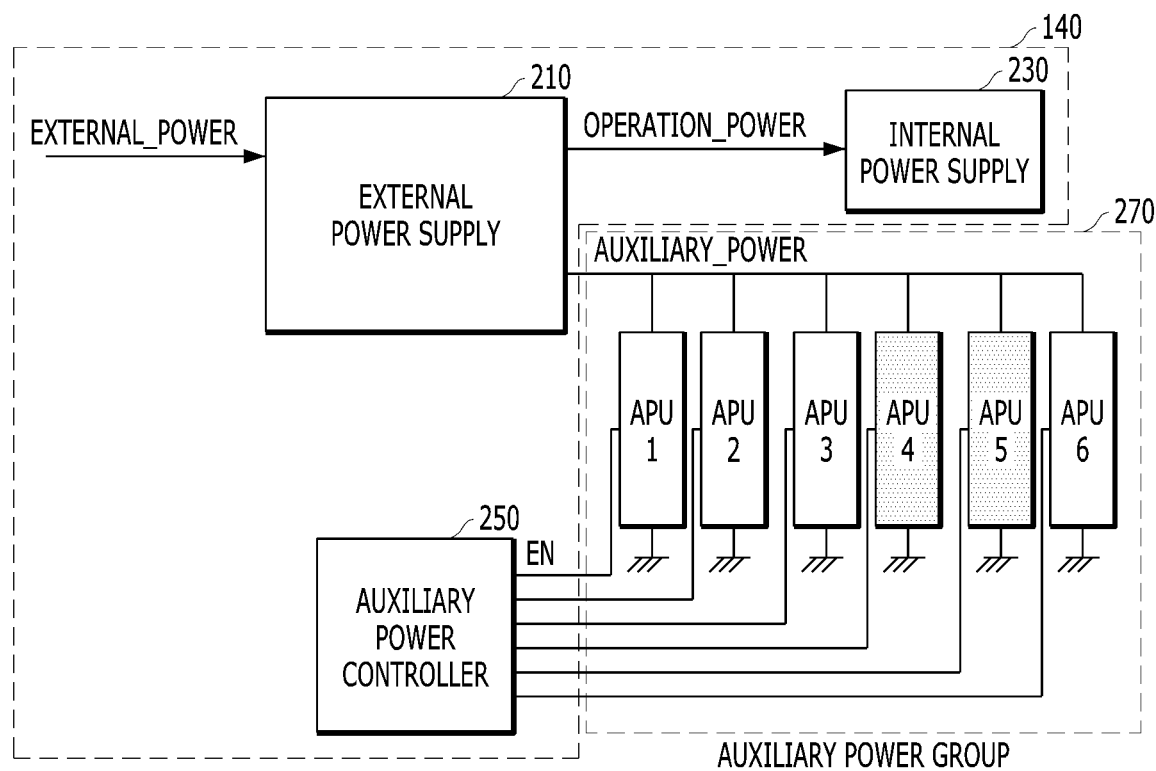
FIG. 10 is a diagram schematically illustrating a structure of a power manager in accordance with the embodiment.

FIG. 10 is a diagram schematically illustrating the structure of the power manager 140 in accordance with an embodiment of the present disclosure. For example, FIG. 10 illustrates the case in which two auxiliary power circuits APU4 and APU5 among the auxiliary power circuits APU1 to APU6 in the power manager 140 did not pass the discharge test.

For the discharge test of FIG. 10, the auxiliary power controller 250 may disable the fourth and fifth auxiliary power circuits APU4 and APU5 which did not pass the discharge test. In FIG. 10, shaded portions indicate the disabled fourth and fifth auxiliary power circuits APU4 and APU5. As illustrated in FIG. 10, the auxiliary power circuits may be determined to be defective auxiliary power circuits, such that only a minimum number of auxiliary power circuits required for stably shutting down the memory system 110 are enabled. In accordance with an embodiment of the present disclosure, when only a minimum number of auxiliary power circuits are enabled, the auxiliary power controller 250 may perform the partial discharge test on the enabled auxiliary power circuits.

Figure 11:
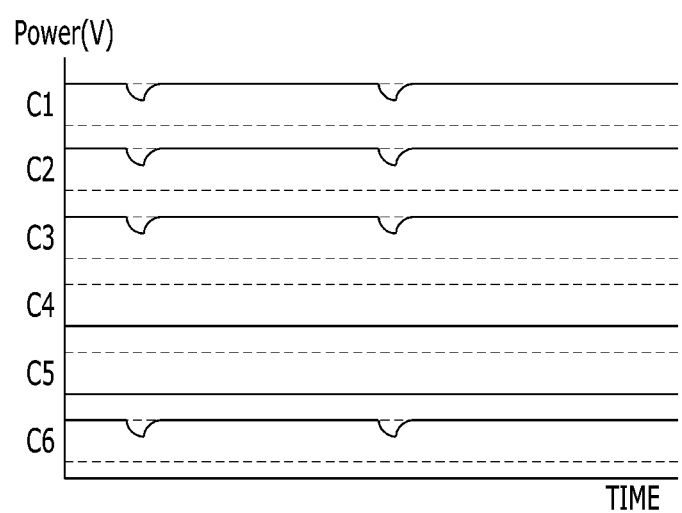
FIG. 11 is a timing diagram illustrating a discharge test in accordance with an embodiment.

FIG. 11 is a timing diagram illustrating a discharge test in accordance with an embodiment. For example, FIG. 11 illustrates the potentials of the capacitors of the auxiliary power circuits over time.

Referring to FIG. 11, the fourth and fifth auxiliary power circuits APU4 and APU5 are disabled. The auxiliary power controller 250 may perform the partial discharge test on the first, second, third and sixth auxiliary power circuits APU1, APU2, APU3 and APU6 in a predetermined period.

FIG. 12 is a flowchart illustrating an operation of the auxiliary power controller 250 in accordance with the embodiment.

Referring to FIG. 12, in step S1202, the auxiliary power controller 250 may divide the auxiliary power circuits into the test group and the operation group. The number of auxiliary power circuits in the operation group needs to be greater than or equal to the minimum number of auxiliary power circuits for maintaining the integrity of the memory system 110.

In step S1204, the auxiliary power controller 250 may perform the full discharge test on the auxiliary power circuits of the test group. The full discharge test operation of step S1204 may include sub operations of steps S602, S604 and S606 in FIG. 6.

In step S1206, the auxiliary power controller 250 may determine whether the auxiliary power circuits of the test group passed the full discharge test. For example, the auxiliary power controller 250 may determine whether the time required until the capacitors in the respective auxiliary power circuits are fully discharged is greater than or equal to a threshold time.

When the auxiliary power circuits passed the full discharge test ("YES" in step S1206), the auxiliary power controller 250 may group the auxiliary power circuits as the test group and the operation group again in step S1202. The auxiliary power controller 250 may perform the full discharge test on all of the auxiliary power circuits by periodically repeating steps S1202, S1204 and S1206 on the test group including the predetermined number of auxiliary power circuits.

When there is an auxiliary power circuit which did not pass the full discharge test ("NO" in step S1206), the auxiliary power controller 250 may disable the auxiliary power circuit which did not pass the full discharge test, in step S1208.

In step S1210, the auxiliary power controller 250 may determine whether there are spare auxiliary power circuits. For example, the auxiliary power controller 250 may determine whether the number of enabled auxiliary power circuits exceeds the minimum number of auxiliary power circuits required by the memory system 110.

When there are spare auxiliary power circuits ("YES" in step S1210), the auxiliary power controller 250 may group the enabled auxiliary power circuits as the test group and the operation group again in step S1202. The auxiliary power controller 250 may perform the full discharge test on all of the enabled auxiliary power circuits by periodically repeating steps S1202, S1204 and S1206 on the test group including the predetermined number of auxiliary power circuits.

When there are no spare auxiliary power circuits ("NO" in step S1210), the auxiliary power controller 250 may periodically perform the partial discharge test on the enabled auxiliary power circuits in step S1212.

When the wear levels of the auxiliary power circuits increase, the number of enabled auxiliary power circuits may be less than the minimum number of auxiliary power circuits. In an embodiment, when the number of enabled auxiliary power circuits is less than the minimum number of auxiliary power circuits, the power manager 140 may provide a signal to the processor 134. In response to the signal, the processor 134 may directly store host data received from the host in the memory device 150, instead of buffering the host data in the memory 138 and storing the buffered data in the memory device 150.

In accordance with an embodiment, the memory system 110 may include the plurality of capacitors to retain a larger amount of power than the minimum amount of emergency power for maintaining the integrity of the memory system 110. The memory system 110 may group the plurality of capacitors as the operation group capable of supplying the minimum amount of emergency power and the test group for the discharge test. The memory system 110 may perform the full discharge test on the test group while performing the grouping in a predetermined period, such that the full discharge test can be performed on all of the capacitors.

In accordance with an embodiment of the present disclosure, the wear levels of all the capacitors in the memory system 110 may be accurately determined. Although power supply from the outside is removed while the full discharge test is performed, the memory system 110 may dump volatile data stored in the memory 138 into the memory device 150, using the minimum amount of emergency power stored in the capacitors of the operation group, thereby maintaining the integrity of the host data received by the memory system 110. That is, in accordance with an embodiment of the present disclosure, the reliability of the memory system 110 can be improved.

In accordance with various embodiments, it is possible to provide a memory system which may assure reliability by guaranteeing a stable system shutdown even in case of an SPO, and an operation method thereof.

The memory system, which may store emergency power during a normal operation and supply the emergency power to the controller and the memory device when external power is removed, may retain emergency power even during a discharge test. Although the supply of the external power is suddenly removed during the discharge test, the memory system may perform the system shutdown using the emergency power, thereby maintaining the integrity of the internal data.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
a memory device suitable for storing data;
a controller suitable for controlling the memory device;
a power manager suitable for receiving external power, and supplying operation power to the memory device and the controller; and
a plurality of auxiliary power circuits suitable for receiving the operation power from the power manager, storing the received power, and supplying auxiliary power to the power manager when the external power is removed,
wherein the power manager is suitable for grouping and manages selected auxiliary power circuits among the plurality of auxiliary power circuits as a test group, and performs a full discharge test on the selected auxiliary power circuits,
wherein the power manager comprises:
an auxiliary power controller suitable for performing the full discharge test on the selected auxiliary power circuits,
wherein the auxiliary power controller is suitable for grouping and managing remaining auxiliary power circuits, which are the auxiliary power circuits other than the selected auxiliary power circuits among the plurality of auxiliary power circuits, as an operation group for supplying the auxiliary power, and
wherein the auxiliary power controller is suitable for periodically changing the test group and the operation group such that the full discharge test is performed on all of the auxiliary power circuits as time elapses, and performing the full discharge test for each test group.

2. The memory system of claim 1, wherein the power manager is configured in the controller.

3. The memory system of claim 1, wherein the power manager further comprises:
a power supply suitable for supplying the operation power to the memory device and the controller.

4. The memory system of claim 1, wherein the auxiliary power controller is suitable for grouping the plurality of auxiliary power circuits as the operation group and the test group in response to the full discharge test result.

5. The memory system of claim 1, wherein the auxiliary power controller is suitable for grouping, as the operation group, a minimum number of auxiliary power circuits which are required for storing information of the controller in the memory device when the external power is removed, among the plurality of auxiliary power circuits, and grouping, as the test group, auxiliary power circuits excluding the operation group among the plurality of auxiliary power circuits.

6. The memory system of claim 5, wherein the auxiliary power controller disables auxiliary power circuits which do not pass the full discharge test.

7. The memory system of claim 6, wherein, when the number of enabled auxiliary power circuits among the plurality of auxiliary power circuits is less than or equal to the minimum number, the auxiliary power controller performs a partial discharge test on the enabled auxiliary power circuits.

8. The memory system of claim 1, wherein the auxiliary power controller is suitable for grouping, as the operation group, a minimum number of auxiliary power circuits required for using the auxiliary power as the operation power, among the plurality of auxiliary power circuits, and grouping, as the test group, auxiliary power circuits excluding the operation group among the plurality of auxiliary power circuits.

9. An operating method of a memory system which includes a plurality of auxiliary power circuits for supplying auxiliary power to the memory system when external power is removed, the operating method comprising:
grouping, as a test group, selected auxiliary power circuits among the plurality of auxiliary power circuits;
performing a full discharge test on the selected auxiliary power circuits,
grouping remaining auxiliary power circuits, which are the auxiliary power circuits other than the selected auxiliary power circuits among the plurality of auxiliary power circuits, as an operation group for the supplying the auxiliary power; and
grouping the plurality of auxiliary power circuits as the operation group and the test group in response to the full discharge test result.

10. The operating method of claim 9, further comprising periodically changing the test group and the operation group such that the full discharge test is performed on all of the plurality of auxiliary power circuits as time elapses.

11. The operating method of claim 10, wherein the grouping of the remaining auxiliary power circuits as the operation group for the supplying the auxiliary power comprises grouping, as the operation group, a minimum number of auxiliary power circuits required for storing information of an internal volatile memory in the memory device, among the plurality of auxiliary power circuits, when the external power is removed.

12. The operating method of claim 11, further comprising disabling the auxiliary power circuit which does not pass the full discharge test.

13. The operating method of claim 12, further comprising performing a partial discharge test on the enabled auxiliary power circuits, when the number of enabled auxiliary power circuits among the plurality of auxiliary power circuits is less than or equal to the minimum number of auxiliary power circuits.

14. The operating method of claim 10, wherein the grouping of the remaining auxiliary power circuits as the operation group for the supplying the auxiliary power comprises grouping, as the operation group, a minimum number of auxiliary power circuits required for using the auxiliary power as the operation power, among the plurality of auxiliary power circuits.

15. A memory system comprising:
- a memory device suitable for storing data;
- a controller suitable for controlling the memory device;
- a power manager suitable for receiving external power, and supplying operation power to the memory device and the controller; and
- a plurality of auxiliary power circuits suitable for receiving the operation power from the power manager, storing the received power, and supplying auxiliary power to the power manager when the external power is removed,
- wherein the power manager is suitable for grouping and managing selected auxiliary power circuits among the plurality of auxiliary power circuits as a test group, and performing a full discharge test on the selected auxiliary power circuits, and
- wherein the power manager is suitable for grouping, as an operation group, a minimum number of auxiliary power circuits which are required for storing information of the controller in the memory device when the external power is removed, among the plurality of auxiliary power circuits, and grouping, as the test group, auxiliary power circuits excluding the operation group among the plurality of auxiliary power circuits.

* * * * *